United States Patent
Aoki et al.

(10) Patent No.: US 10,362,712 B2
(45) Date of Patent: Jul. 23, 2019

(54) HEAT RECEIVER, COOLING UNIT, AND ELECTRONIC DEVICE

(71) Applicant: FUJITSU LIMITED, Kawasaki-shi, Kanagawa (JP)

(72) Inventors: Michimasa Aoki, Kawasaki (JP); Masumi Suzuki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/372,685

(22) Filed: Dec. 8, 2016

(65) Prior Publication Data

US 2017/0181320 A1    Jun. 22, 2017

(30) Foreign Application Priority Data

Dec. 22, 2015   (JP) .................................. 2015-250353

(51) Int. Cl.
    *H05K 7/20*         (2006.01)

(52) U.S. Cl.
    CPC ..... *H05K 7/20509* (2013.01); *H05K 7/20145* (2013.01); *H05K 7/20263* (2013.01)

(58) Field of Classification Search
    CPC ........... H05K 7/20509; H05K 7/20145; H05K 7/20263
See application file for complete search history.

(56) References Cited

U.S. PATENT DOCUMENTS

| | | | |
|---|---|---|---|
| 2004/0104010 A1* | 6/2004 | Kenny | F04B 19/006 165/80.4 |
| 2008/0043438 A1* | 2/2008 | Refai-Ahmed | F28D 15/0266 361/700 |
| 2009/0080159 A1 | 3/2009 | Ippoushi et al. | |
| 2010/0259888 A1* | 10/2010 | Pomytkin | G06F 1/20 361/679.47 |

FOREIGN PATENT DOCUMENTS

| | | |
|---|---|---|
| JP | 2002-164490 A | 6/2002 |
| JP | 2006-196766 A | 7/2006 |
| JP | 2007-150203 | 6/2007 |
| WO | WO 2013/039026 A1 | 3/2013 |

OTHER PUBLICATIONS

JPOA—Office Action of Japanese Patent Application No. 2015-250353 dated Feb. 26, 2019 with full machine translation. **JP2006-196766 cited in the JPOA was previously submitted in the IDS filed on Dec. 8, 2016 and considered by the Examiner on Aug. 8, 2017.

* cited by examiner

*Primary Examiner* — Mukundbhai G Patel
*Assistant Examiner* — Zhengfu J Feng
(74) *Attorney, Agent, or Firm* — Fujitsu Patent Center

(57) ABSTRACT

A heat receiver includes a first heat receiving body that includes a first flow path through which a coolant flows; and a second heat receiving body, provided on one side of the first heat receiving body, that includes a second flow path through which the coolant discharged from the first flow path flows. A flow path cross-sectional area of the second flow path is less than a flow path cross-sectional area of the first flow path so that the flow speed of the coolant is higher in the second flow path than in the first flow path, which enhances the cooling efficiency.

8 Claims, 12 Drawing Sheets

HEAT RECEIVER, COOLING UNIT, AND ELECTRONIC DEVICE

CROSS-REFERENCE TO RELATED APPLICATION

This application is based upon and claims the benefit of priority of the prior Japanese Patent Application No. 2015-250353, filed on Dec. 22, 2015, the entire contents of which are incorporated herein by reference.

FIELD

The embodiment discussed herein is related to a heat receiver, a cooling unit, and an electronic device.

BACKGROUND

Central processing units (CPUs) provided in personal computers (PCs) and servers, for example, occasionally have lowered functions at high temperatures. Thus, in order to cool a heat generating body such as the CPU, there is used a cooling unit that includes a heat receiver or the like that receives heat from the heat generating body and cools the heat generating body.

There are disclosed, as examples of such a cooling unit, a heat-transfer container of a two-layer structure in which a first path and a second path in which a cooling fluid flows are superposed vertically via a partition wall, and a construction in which a heat generating body is cooled using a stacked cooler or the like structured such that a cooling water path makes a U-turn (see Japanese Laid-open Patent Publication No. 2006-196766, Japanese Laid-open Patent Publication No. 2002-164490, and International Publication Pamphlet No. 2013/039026, for example).

In recent years, the amount of heat generated by the CPU has been increasing along with improvement in performance. Therefore, it is desired to further improve the performance of the heat receiver, which is provided in the cooling unit, to cool the heat generating body such as the CPU.

It is desirable to provide a heat receiver with improved cooling performance to cool a heat generating body.

SUMMARY

According to an aspect of the invention, a heat receiver includes a first heat receiving body that includes a first flow path through which a coolant flows; and a second heat receiving body, provided on one side of the first heat receiving body, that includes a second flow path through which the coolant discharged from the first flow path flows. A flow path cross-sectional area of the second flow path is less than a flow path cross-sectional area of the first flow path so that the flow speed of the coolant is higher in the second flow path than in the first flow path, which enhances the cooling efficiency.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Figure 1:
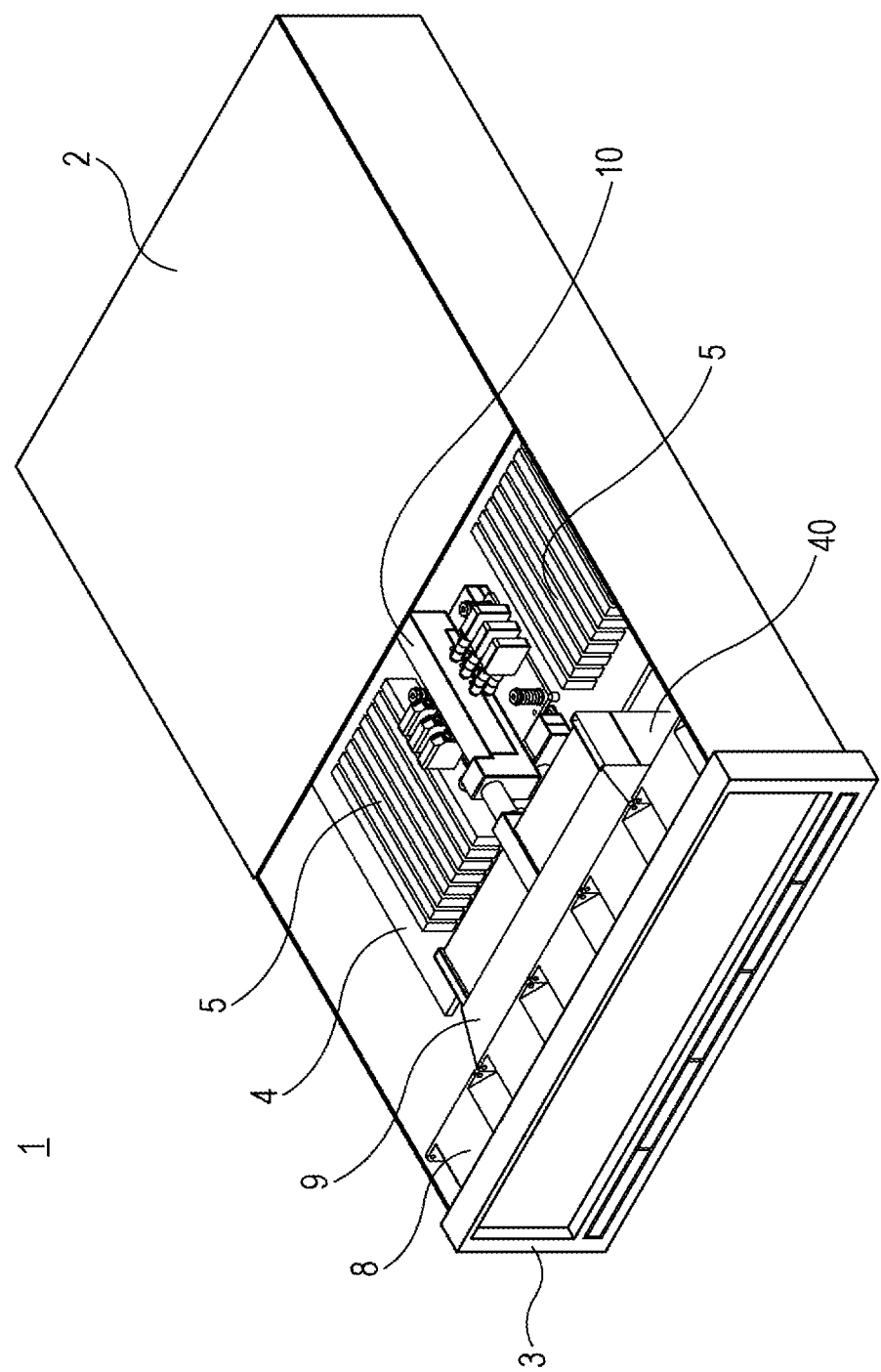
FIG. 1 illustrates an electronic device according to an embodiment.

An embodiment will be described below with reference to the drawings. In the drawings, identical constituent portions are occasionally given identical symbols to omit redundant description.

FIG. 1 illustrates an electronic device 1 according to the embodiment.

As illustrated in FIG. 1, the electronic device 1 has a housing 2, a printed circuit board 4, a cooling fan 8, a duct 9, and a cooling unit 10. Examples of the electronic device 1 include a PC and a server.

The printed circuit board 4, the cooling fan 8, the cooling unit 10, and so forth are provided inside the housing 2. The front surface of the housing 2 is covered by a front panel 3. In FIG. 1, a part of the upper surface of the housing 2 has been removed such that the inside of the electronic device 1 may be seen. Memories 5, a CPU (not illustrated in FIG. 1), and so forth are mounted on the printed circuit board 4. The cooling fan 8 is provided behind the front panel 3, and blows air toward a heat exchanger 40 of the cooling unit 10 via the duct 9. The cooling unit 10 cools the CPU which is provided on the printed circuit board 4.

Figure 2:
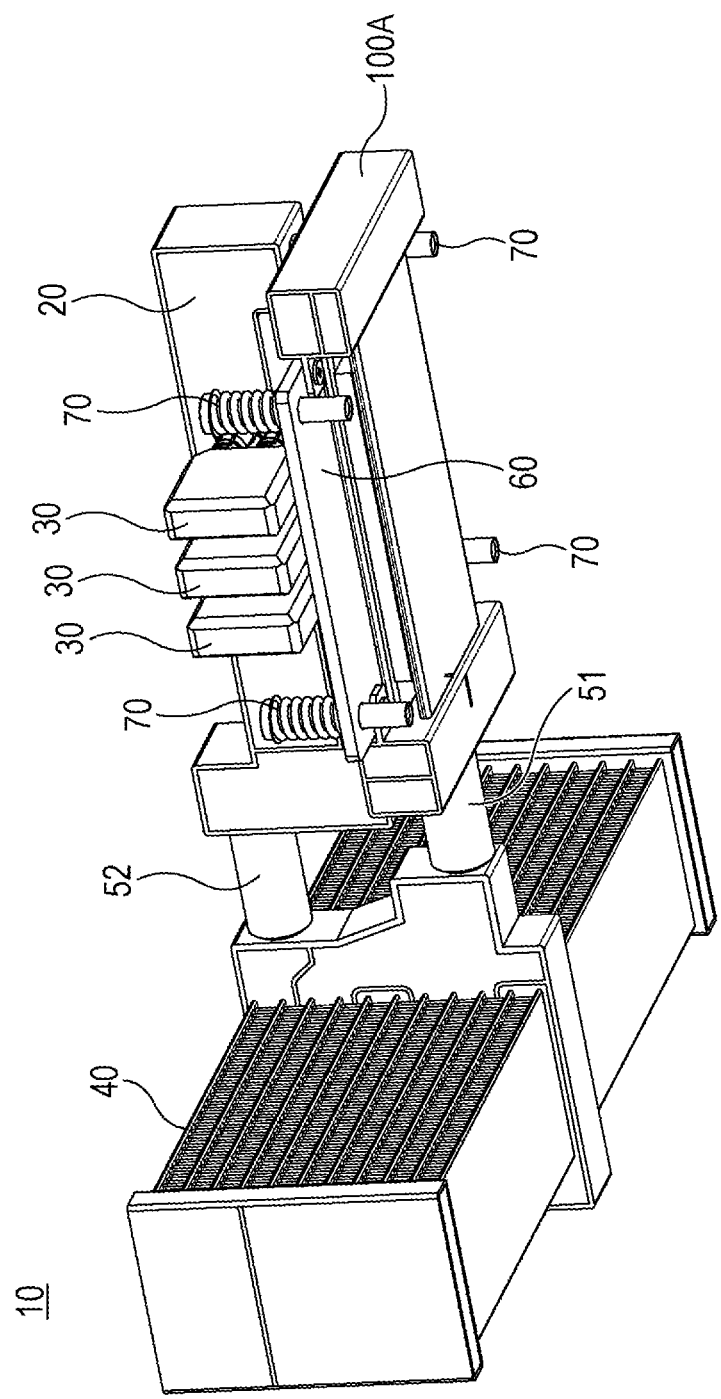
FIG. 2 illustrates a cooling unit according to the embodiment.

FIG. 2 illustrates the cooling unit 10 according to the embodiment.

As illustrated in FIG. 2, the cooling unit 10 has a tank 20, pumps 30, the heat exchanger 40, the pushing plate 60, and a heat receiver 100A.

The tank 20 stores a coolant such as water and propylene glycol, for example. The coolant is not limited to a liquid such as water, and may be a gas such as air. The pumps 30 serve as a coolant supply that supplies the coolant which is stored in the tank 20 to the heat receiver 100A. The coolant which is supplied to the heat receiver 100A flows from a connection tube 51 to the heat exchanger 40 through a flow path formed inside the heat receiver 100A. The coolant is heated by receiving heat from the CPU, which is provided on the printed circuit board 4, while passing through the heat receiver 100A.

The heat exchanger 40 includes a plurality of stacked plates in which the coolant flows. The coolant, which has flowed from the heat receiver 100A into the heat exchanger 40, radiates heat received from the CPU in the heat receiver 100A via fins or the like provided between the plates of the heat exchanger 40 while flowing in the plates. The heat exchanger 40 is air-cooled by the cooling fan 8 which is provided in the electronic device 1. The coolant, which has been cooled through heat radiation in the heat exchanger 40, flows from the heat exchanger 40 to the tank 20 again through a connection tube 52.

The pushing plate 60 is fixed to the printed circuit board 4 by spring screws 70, and presses the heat receiver 100A against the CPU which is provided on the printed circuit board 4. The pushing plate 60 is formed from stainless steel or the like.

Figure 3:
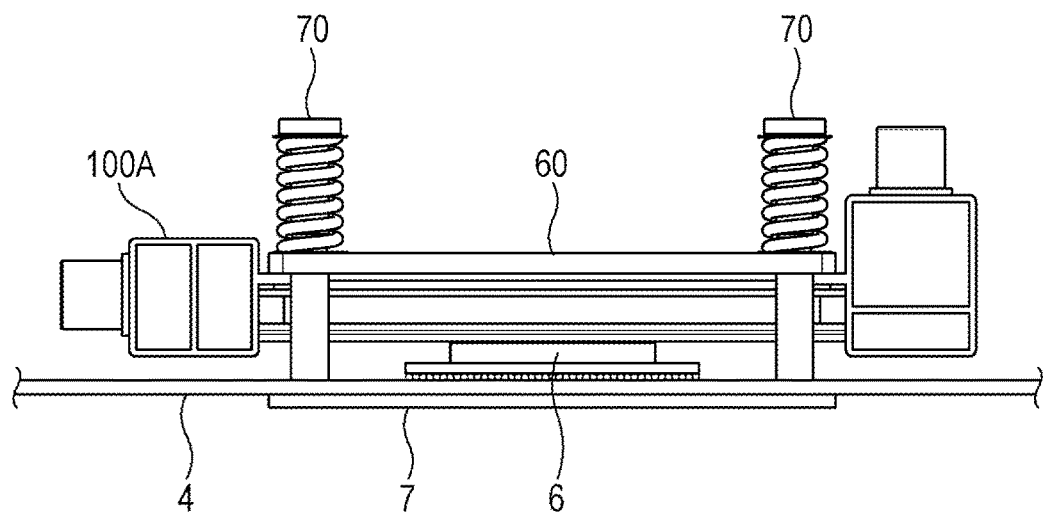
FIG. 3 illustrates the configuration of a heat receiver and a pushing plate of the cooling unit.

FIG. 3 illustrates the configuration of the heat receiver 100A and the pushing plate 60 of the cooling unit 10.

The pushing plate 60 is fixed to the printed circuit board 4 by the spring screws 70 so as to press the heat receiver 100A against a CPU 6 provided on the printed circuit board 4. The heat receiver 100A is pressed by the pushing plate 60 so that the lower surface of the heat receiver 100A contacts the upper surface of the CPU 6 in FIG. 3.

The heat receiver 100A is pressed by the pushing plate 60 to contact the CPU 6 to receive heat from the CPU 6. In order to facilitate heat conduction between the heat receiver 100A and the CPU 6, a thermal connection member such as silicone grease or a silicone sheet may be interposed between the heat receiver 100A and the CPU 6, for example.

A backing plate 7 is fixed to a surface of the printed circuit board 4 opposite to the CPU 6 by the spring screws 70. The backing plate 7 suppresses deformation, such as a warp, of the printed circuit board 4 due to the CPU 6 being pressed by the heat receiver 100A. The backing plate 7 is formed from stainless steel or the like.

Figure 4:
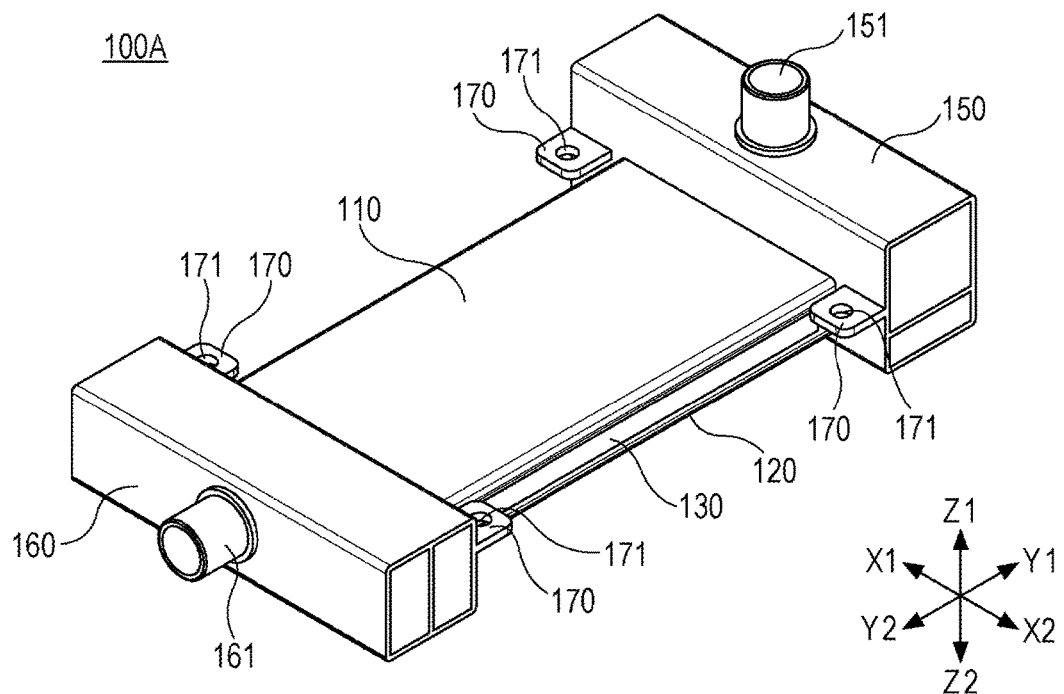
FIG. 4 is a first perspective view of the heat receiver according to the embodiment.
Figure 5:
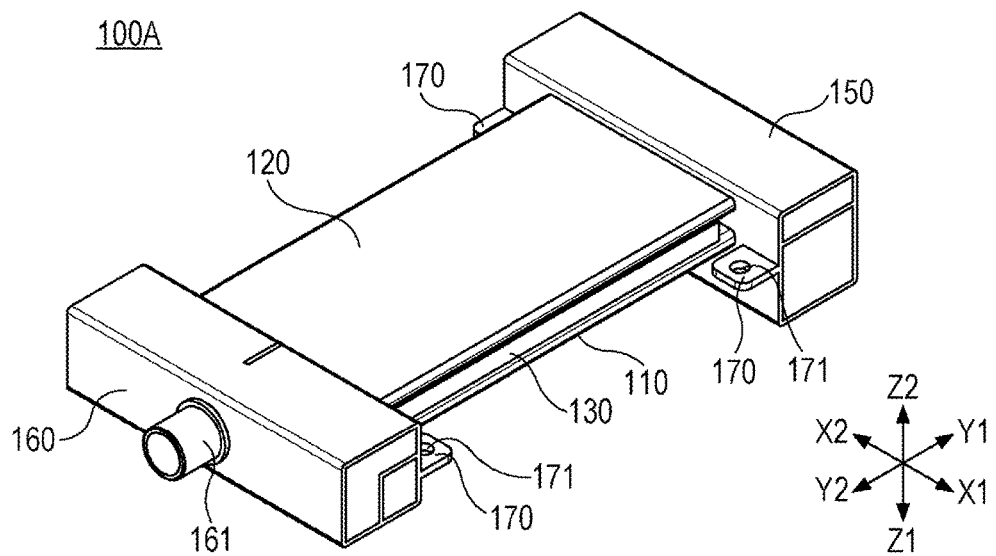
FIG. 5 is a second perspective view of the heat receiver according to the embodiment.
Figure 6:
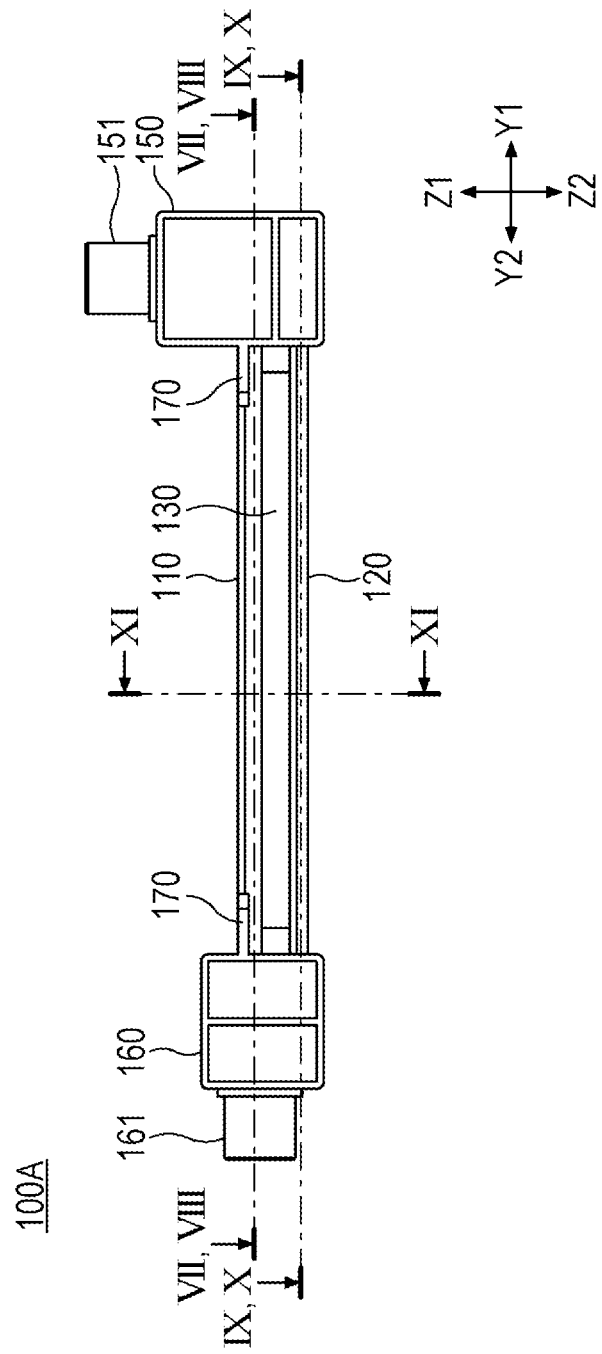
FIG. 6 is a side view of the heat receiver according to the embodiment.

FIGS. 4 and 5 are each a perspective view of the heat receiver 100A according to the embodiment. FIG. 4 is a perspective view of the heat receiver 100A as seen from the side of a first heat receiving body 110. FIG. 5 is a perspective view of the heat receiver 100A as seen from the side of a second heat receiving body 120. FIG. 6 is a side view of the heat receiver 100A according to the embodiment.

The X1-X2 direction indicated in the drawings corresponds to the direction of the width of the heat receiver 100A. The Y1-Y2 direction corresponds to the direction of the depth of the heat receiver 100A which is orthogonal to the X1-X2 direction. The Z1-Z2 direction corresponds to the direction of the height of the heat receiver 100A which is orthogonal to the X1-X2 direction and the Y1-Y2 direction.

As illustrated in FIGS. 4 to 6, the heat receiver 100A has the first heat receiving body 110, the second heat receiving body 120, a connection plate 130, a first coupling body 150, and a second coupling body 160. The first heat receiving body 110, the second heat receiving body 120, the connection plate 130, the first coupling body 150, and the second coupling body 160 are formed from a metal material such as aluminum and copper, for example.

The first heat receiving body 110 is formed in a flat plate shape, and provided between the first coupling body 150 and the second coupling body 160. The first heat receiving body 110 has a flow path for the coolant. The flow path is provided inside the first heat receiving body 110, and leads to the first coupling body 150 and the second coupling body 160. The first heat receiving body 110 radiates heat of the CPU 6, which is conducted from the second heat receiving body 120 via the connection plate 130, to the coolant which flows in the flow path.

The second heat receiving body 120 is formed in a flat plate shape, and provided between the first coupling body 150 and the second coupling body 160. The second heat receiving body 120 has a flow path for the coolant. The flow path is provided inside the second heat receiving body 120, and leads to the first coupling body 150 and the second coupling body 160. The second heat receiving body 120 is stacked on the side of the heat generating body of the first heat receiving body 110, and abuts against the CPU 6 which is provided on the printed circuit board 4.

The connection plate 130 is provided between the first heat receiving body 110 and the second heat receiving body 120. The connection plate 130 is joined to the first heat receiving body 110 and the second heat receiving body 120 by a joint material such as an alloy (solder), for example. The connection plate 130 conducts heat received from the CPU 6 by the second heat receiving body 120 to the first heat receiving body 110 as being diffused. In order to improve the efficiency of heat reception at the first heat receiving body 110 by enhancing the diffusion of heat conducted from the second heat receiving body 120, the connection plate 130 may be formed from a material that is more thermally conductive than the first heat receiving body 110 and the second heat receiving body 120, for example.

The first coupling body 150 couples the first heat receiving body 110 and the second heat receiving body 120 to each other, and supports the first heat receiving body 110 and the second heat receiving body 120 between the second coupling body 160 and the first coupling body 150. The first coupling body 150 has an in-flow port 151 into which the coolant which is supplied from the tank 20 of the cooling unit 10 flows. A space in which the coolant flows is formed inside the first coupling body 150. The in-flow port 151 may be provided at a position that is different from that in the embodiment, depending on the positional relationship with the tank 20 in the cooling unit 10.

The second coupling body 160 couples the first heat receiving body 110 and the second heat receiving body 120 to each other, and supports the first heat receiving body 110 and the second heat receiving body 120 between the first coupling body 150 and the second coupling body 160. A space in which the coolant flows is formed inside the second coupling body 160. The second coupling body 160 has a discharge port 161 from which the coolant is discharged to the heat exchanger 40 of the cooling unit 10. The discharge port 161 may be provided at a position that is different from that in the embodiment, depending on the positional relationship with the heat exchanger 40 in the cooling unit 10.

The first coupling body 150 and the second coupling body 160 are each provided with a fixation flange 170 configured to fix the heat receiver 100A to the pushing plate 60. The heat receiver 100A is fixed to the pushing plate 60 by screws inserted into screw holes 171 of the fixation flanges 170. In the heat receiver 100A, the first heat receiving body 110 is pressed in the Z2 direction by the pushing plate 60 so that the second heat receiving body 120 contacts and thermally coupled to the CPU 6 which is provided on the printed circuit board 4.

Next, the flow of the coolant in the heat receiver 100A will be described with reference to FIGS. 7 to 11.

Figure 7:
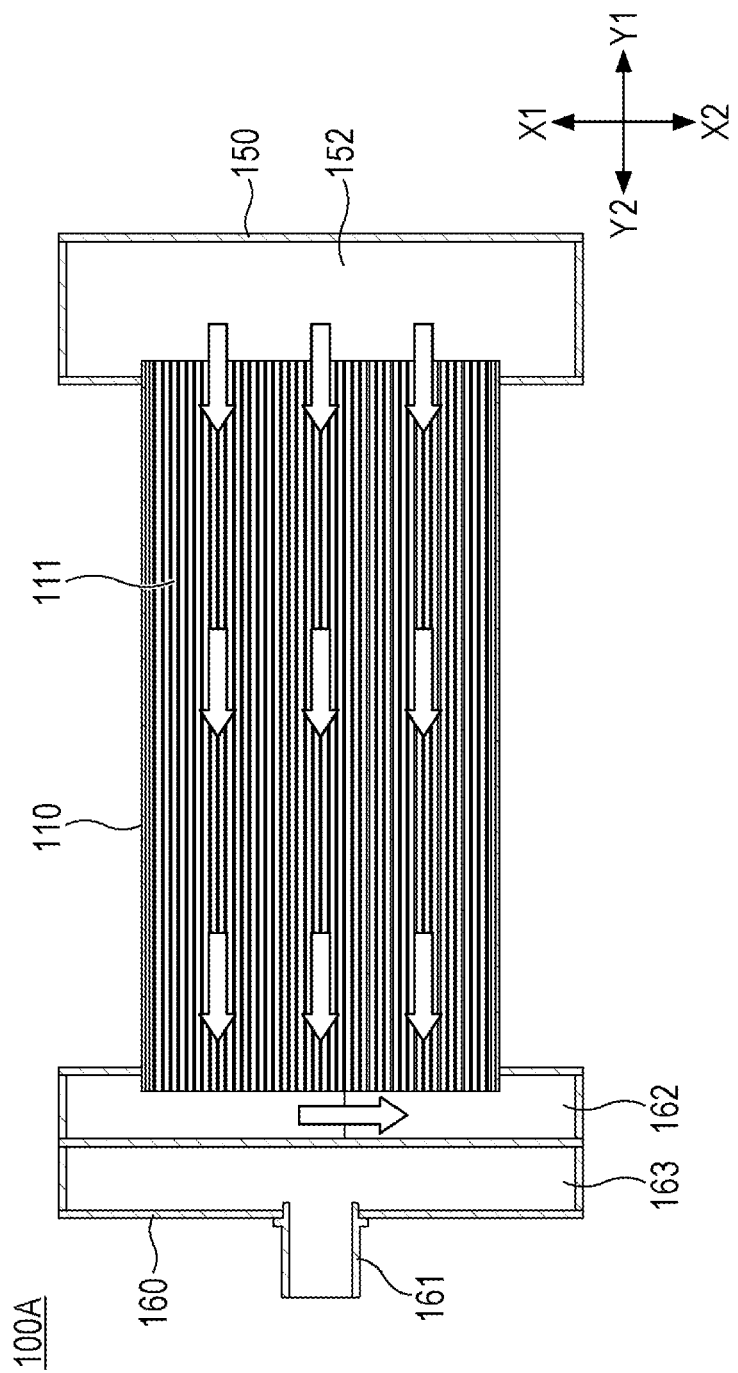
FIG. 7 is a sectional view taken along the line VII-VII of FIG. 6.
Figure 8:
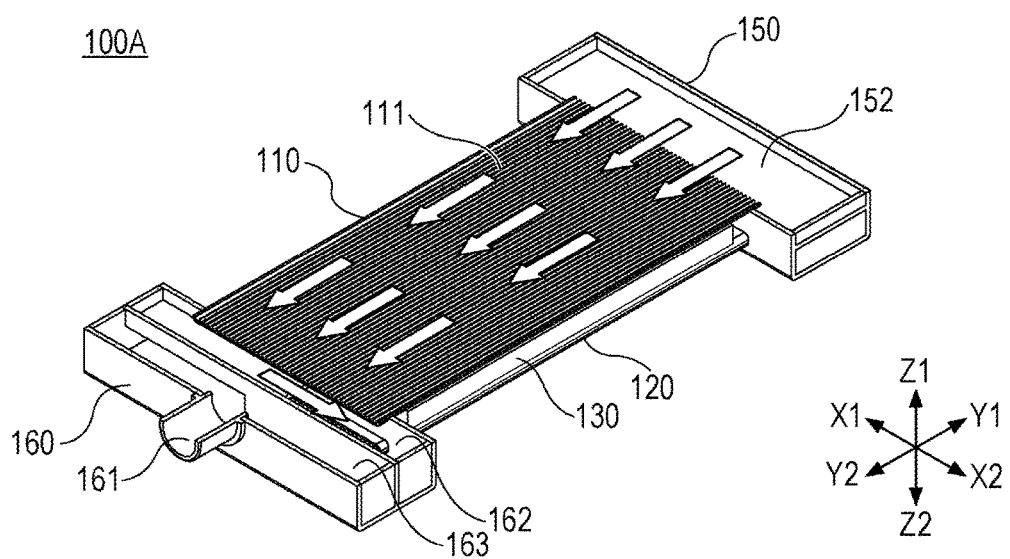
FIG. 8 is a sectional perspective view taken along the line VIII-VIII of FIG. 6.
Figure 9:
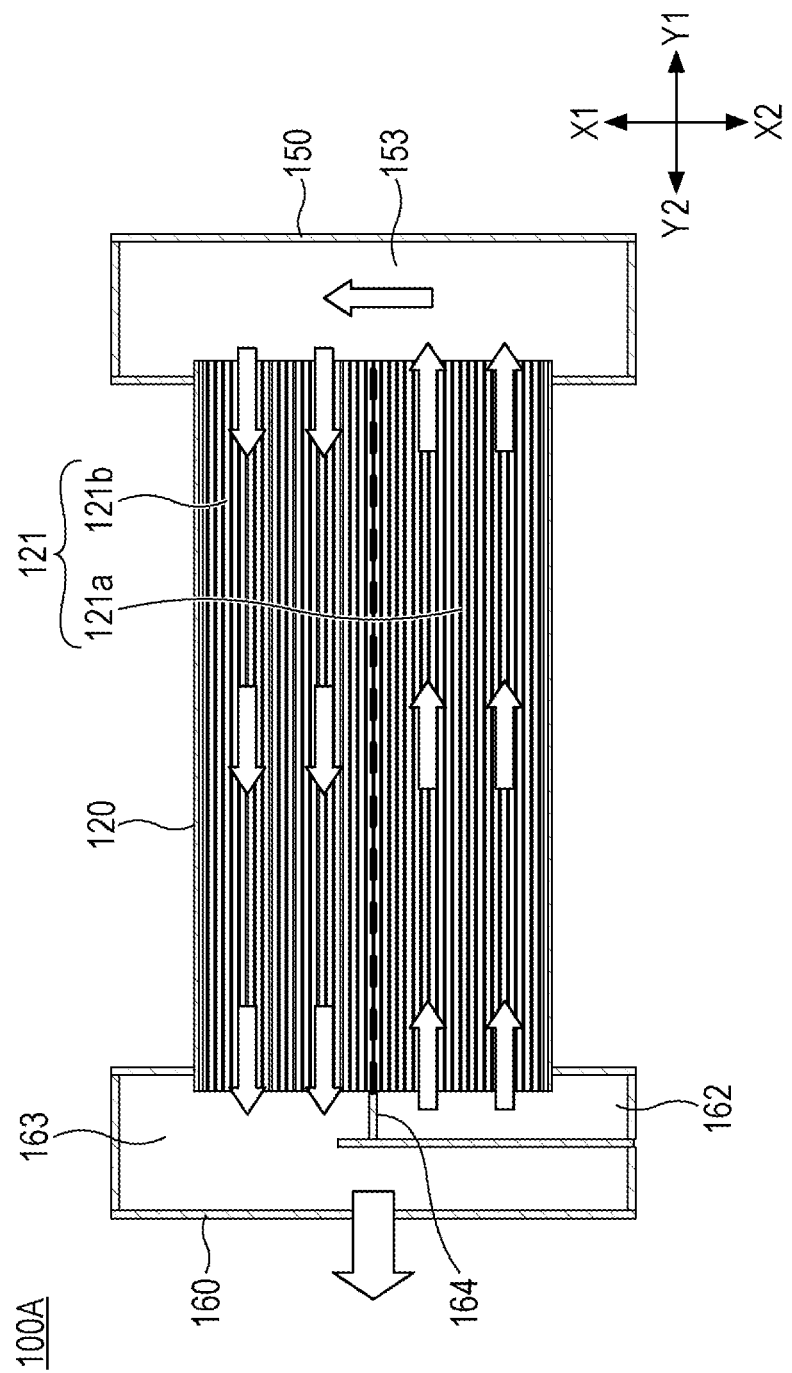
FIG. 9 is a sectional view taken along the line IX-IX of FIG. 6.
Figure 10:
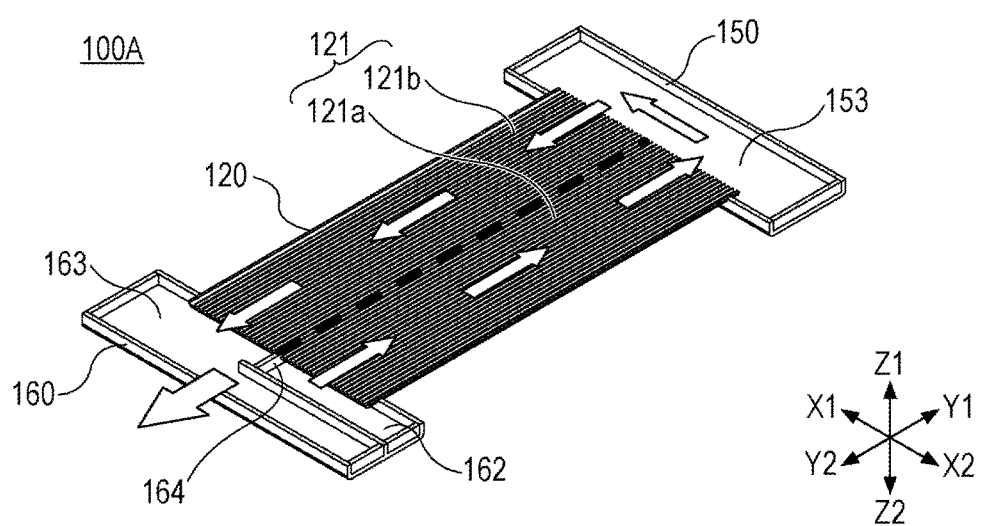
FIG. 10 is a sectional perspective view taken along the line X-X of FIG. 6.
Figure 11:
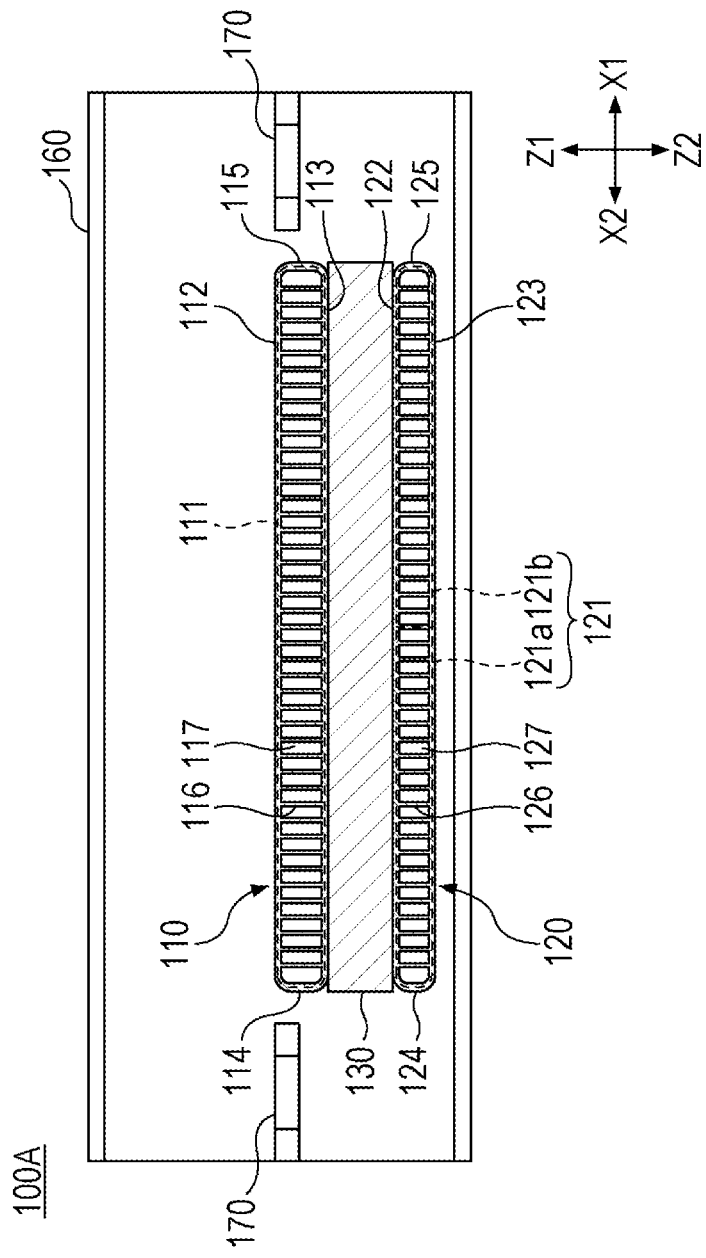
FIG. 11 is a sectional view taken along the line XI-XI of FIG. 6.

FIG. 7 is a sectional view taken along the line VII-VII of FIG. 6. FIG. 8 is a sectional perspective view taken along the line VIII-VIII of FIG. 6. FIG. 9 is a sectional view taken along the line IX-IX of FIG. 6. FIG. 10 is a sectional perspective view taken along the line X-X of FIG. 6. FIG. 11 is a sectional view taken along the line XI-XI of FIG. 6. The white arrows illustrated in FIGS. 7 to 10 indicate the direction in which the coolant flows.

As illustrated in FIGS. 7 and 8, the first coupling body 150 has a supply chamber 152 that leads to a first flow path 111 of the first heat receiving body 110. The supply chamber 152 is formed so as to lead to the in-flow port 151, and supplies the coolant, which flows in from the in-flow port 151, to the first flow path 111 of the first heat receiving body 110. The coolant, which is supplied from the tank 20 of the cooling unit 10 to the heat receiver 100A, flows from the in-flow port 151 to the first flow path 111 of the first heat receiving body 110 through the supply chamber 152.

As illustrated in FIGS. 7 and 8, the first heat receiving body 110 has the first flow path 111 which leads to the supply chamber 152 of the first coupling body 150 and a second communication chamber 162 of the second coupling body 160. In the first flow path 111, the coolant flows in the Y2 direction from the supply chamber 152 of the first coupling body 150 toward the second communication chamber 162 of the second coupling body 160.

As illustrated in FIG. 11, the first flow path 111 is surrounded by a top plate 112, a bottom plate 113, and side plates 114 and 115. The first flow path 111 has a plurality of plate-shaped fins 116 coupled to the top plate 112 and the bottom plate 113 and extending in the Y1-Y2 direction, and a plurality of thin tubes 117 separated by the fins 116 and extending in the Y1-Y2 direction. The first flow path 111 is formed such that the plurality of thin tubes 117, which are separated by the fins 116 and extend in the Y1-Y2 direction, are arranged side by side in the X1-X2 direction. In the first flow path 111, heat of the CPU 6 is radiated to the coolant which flows in the plurality of thin tubes 117.

As illustrated in FIGS. 7 and 8, the coolant which is supplied from the supply chamber 152 of the first coupling body 150 to the first flow path 111 flows in the Y2 direction through the plurality of thin tubes 117 of the first flow path 111, and flows into the second communication chamber 162 of the second coupling body 160.

As illustrated in FIGS. 7 to 10, the second coupling body 160 is provided with the second communication chamber 162 which leads to the first flow path 111 of the first heat receiving body 110 and a second flow path 121 of the second heat receiving body 120. The second communication chamber 162 supplies the coolant, which is discharged from the first flow path 111, to the second flow path 121 which is provided in the second heat receiving body 120. The coolant which is discharged from the first flow path 111 to the second communication chamber 162 flows in the X2 direction in the second communication chamber 162 and flows in the Z2 direction toward the second heat receiving body 120, and flows into the second flow path 121 of the second heat receiving body 120.

As illustrated in FIGS. 9 and 10, the second heat receiving body 120 has the second flow path 121 which leads to the first coupling body 150 and the second coupling body 160. The second flow path 121 has a first path 121a that leads to the second communication chamber 162 of the second coupling body 160 and a first communication chamber 153 of the first coupling body 150. The second flow path 121 also has a second path 121b that leads to the first communication chamber 153 of the first coupling body 150 and a discharge chamber 163 of the second coupling body 160.

As illustrated in FIG. 11, the second flow path 121 is surrounded by a top plate 122, a bottom plate 123, and side plates 124 and 125. The second flow path 121 has a plurality of plate-shaped fins 126 coupled to the top plate 122 and the bottom plate 123 and formed to extend in the Y1-Y2 direction, and a plurality of thin tubes 127 separated by the fins 126 and extending in the Y1-Y2 direction. The second flow path 121 is formed such that the plurality of thin tubes 127, which are separated by the fins 126 and extend in the Y1-Y2 direction, are arranged side by side in the X1-X2 direction, and divided into the first path 121a and the second path 121b at the center in the X1-X2 direction. In the second flow path 121, heat of the CPU 6 is radiated to the coolant which flows in the plurality of thin tubes 127.

As illustrated in FIGS. 7 to 10, the second coupling body 160 is provided with the second communication chamber 162 which supplies the coolant, which is discharged from the first flow path 111, to the second flow path 121, and the discharge chamber 163 to which the coolant is discharged from the second flow path 121. As illustrated in FIGS. 9 and 10, the second communication chamber 162 and the discharge chamber 163 are formed by a partition wall 164 partitioning a space that leads to the second flow path 121 of the second heat receiving body 120.

The second flow path 121 is divided into the first path 121a, which leads to the second communication chamber 162, and the second path 121b, which leads to the discharge chamber 163, as indicated by the broken line in FIGS. 9 and 10, by the partition wall 164 which separates the second communication chamber 162 and the discharge chamber 163 from each other.

As illustrated in FIGS. 9 and 10, the coolant, which is discharged from the first flow path 111 of the first heat receiving body 110, is supplied from the second communication chamber 162 to the first path 121a, flows in the Y1 direction toward the first coupling body 150 in the first path 121a, and is discharged to the first communication chamber 153 of the first coupling body 150.

The first coupling body 150 is provided with the first communication chamber 153 which is separated from the supply chamber 152. The first communication chamber 153 supplies the coolant, which is discharged from the first path 121a of the second flow path 121, to the second path 121b of the second flow path 121. As illustrated in FIGS. 9 and 10, the coolant which is discharged from the first path 121a of the second flow path 121 flows in the X1 direction in the first communication chamber 153, and flows into the second path 121b of the second flow path 121.

The coolant which is supplied from the first communication chamber 153 of the first coupling body 150 to the second path 121b of the second flow path 121 flows in the Y2 direction through the plurality of thin tubes 127 of the second path 121b, and is discharged to the discharge chamber 163 of the second coupling body 160. The coolant which is discharged to the discharge chamber 163 of the second coupling body 160 is discharged from the heat receiver 100A through the discharge port 161.

In this way, the coolant, which is supplied from the tank 20 of the cooling unit 10 to the heat receiver 100A, flows from the supply chamber 152 of the first coupling body 150 to the second communication chamber 162 of the second coupling body 160 through the first flow path 111 of the first heat receiving body 110. Further, the coolant flows from the second communication chamber 162 to the discharge chamber 163 of the second coupling body 160 through the first path 121a of the second heat receiving body 120, the first communication chamber 153, and the second path 121b, and is discharged from the discharge port 161.

In the heat receiver 100A, heat generated by the CPU 6 is first conducted to the bottom plate 123 of the second heat receiving body 120 which abuts against the CPU 6. The heat of the CPU 6 which is received by the bottom plate 123 is conducted from the bottom plate 123 to the top plate 122 through the side plates 124 and 125 and the plurality of fins 126. In the second heat receiving body 120, the heat which is received from the CPU 6 is radiated to the coolant which flows in the first path 121a and the second path 121b of the second flow path 121 while being conducted from the bottom plate 123 to the top plate 122.

The heat which is not radiated to the coolant in the second heat receiving body 120 is conducted from the top plate 122 of the second heat receiving body 120 to the connection plate 130. The heat which is received from the second heat receiving body 120 by the connection plate 130 is conducted in the Z1 direction toward the first heat receiving body 110 while being spread in the connection plate 130 as being diffused in the X-Y plane.

In the first heat receiving body 110, the heat which is received from the connection plate 130 is conducted from the bottom plate 113 to the top plate 112 through the side plates 114 and 115 and the plurality of fins 116. In the first heat receiving body 110, the heat which is received from the connection plate 130 is radiated to the coolant which flows in the first flow path 111 while being conducted from the bottom plate 123 to the top plate 122.

The coolant which is supplied to the heat receiver 100A flows in the first flow path 111 of the first heat receiving body 110 and the second flow path 121 of the second heat receiving body 120 so as to absorb the heat which has been received from the CPU 6 by the heat receiver 100A and send the heat to the outside.

The heat receiver 100A is formed such that the flow path cross-sectional area of the second flow path 121 of the second heat receiving body 120 is less than the flow path cross-sectional area of the first flow path 111 of the first heat receiving body 110. The flow path cross-sectional area is the total of the areas over which the coolant may flow in a cross section that is orthogonal to the direction in which the coolant flows.

In the embodiment, the flow path cross-sectional area of the first flow path 111 of the first heat receiving body 110 is the total of the areas of the plurality of thin tubes 117 which constitute the first flow path 111 in the X-Z cross section. For the first path 121a, the flow path cross-sectional area of the second flow path 121 of the second heat receiving body 120 is the total of the areas of the thin tubes 127 which are included in the first path 121a in the X-Z cross section. For the second path 121b, meanwhile, the flow path cross-sectional area of the second flow path 121 is the total of the areas of the thin tubes 127 which are included in the second path 121b in the X-Z cross section.

In the embodiment, the second flow path 121 of the second heat receiving body 120 is formed such that both the respective flow path cross-sectional areas for the first path 121a and the second path 121b are less than the flow path cross-sectional area of the first flow path 111. Therefore, the flow rate of the coolant which is circulated through the heat receiver 100A in the first path 121a and the second path 121b of the second flow path 121 is higher than the flow rate thereof in the first flow path 111. Therefore, the coolant may absorb heat of the CPU 6 and rapidly send the heat to the outside in both the first path 121a and the second path 121b, which enhances the efficiency of heat reception at the second heat receiving body 120. When the efficiency of heat reception at the second heat receiving body 120 is enhanced in this way, the cooling performance of the heat receiver 100A to cool the CPU 6 is improved.

The second flow path 121 of the second heat receiving body 120 is formed such that the flow path cross-sectional area of the second flow path 121 is less than the flow path cross-sectional area of the first heat receiving body 110 within such a range that the pressure loss at the heat receiver 100A is not excessively large. In the embodiment, the width of the first path 121a and the width of the second path 121b are the same as each other in the X1-X2 direction. However, the width of the first path 121a and the width of the second path 121b may be different from each other. Even in a configuration in which the width of the first path 121a and the width of the second path 121b are different from each other, the second flow path 121 is formed such that both the flow path cross-sectional area of the first path 121a and the flow path cross-sectional area of the second path 121b are smaller than the flow path cross-sectional area of the first flow path 111 of the first heat receiving body 110.

In the embodiment, in addition, the second flow path 121 has the first path 121a and the second path 121b, and the coolant makes one round trip between the first coupling body 150 and the second coupling body 160 in the second heat receiving body 120. However, the present disclosure is not limited thereto. For example, the second flow path 121 of the second heat receiving body 120 may be constituted of one flow path through which the coolant flows from the second coupling body 160 toward the first coupling body 150. Alternatively, the second flow path 121 of the second heat receiving body 120 may be constituted of three or more flow paths such that the coolant makes one and a half round trips or more between the first coupling body 150 and the second coupling body 160, for example. In any configuration, the flow path cross-sectional area of the second flow path 121 is determined to be less than the flow path cross-sectional area of the first flow path 111.

In the embodiment, in addition, the first heat receiving body 110, the second heat receiving body 120, and the connection plate 130 are formed as separate bodies. However, the connection plate 130 may be formed integrally with at least one of the first heat receiving body 110 and the second heat receiving body 120 as a single member.

Figure 12:
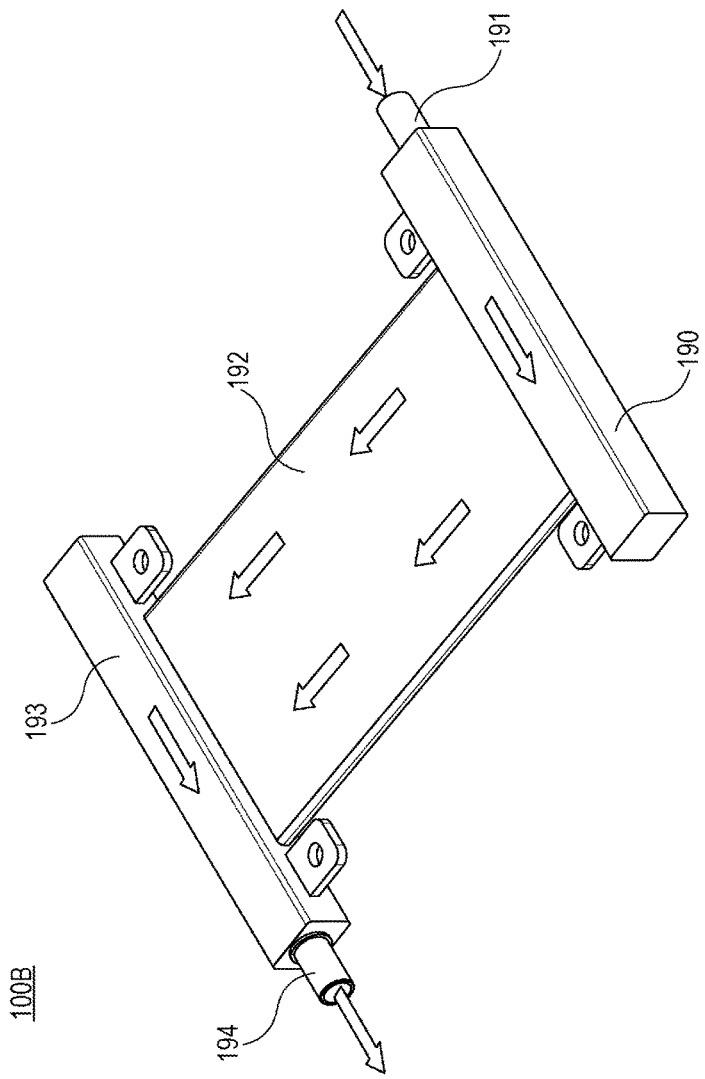
FIG. 12 illustrates a heat receiver according to the related art.

Next, a heat receiver 100B according to the related art will be described. FIG. 12 illustrates the heat receiver 100B according to the related art.

The heat receiver 100B has a first header 190, a flow path 192, and a second header 193. The first header 190 supplies a coolant that flows in from an in-flow port 191 to the flow path 192. The flow path 192 has the same configuration as the first heat receiving body 110 in the embodiment described above, and a flow path that leads to the first header 190 and the second header 193 is formed inside the flow path 192. The second header 193 discharges the coolant, which is discharged from the flow path 192, from a discharge port 194.

In the heat receiver 100B, as indicated by the white arrows in FIG. 12, the coolant flows from the in-flow port 191 through the first header 190, the flow path 192, and the second header 193, and is discharged from the discharge port 194.

The results of calculating a thermal resistance $\theta_{cp1}$ of the heat receiver 100A according to the embodiment described above and a thermal resistance $\theta_{cp2}$ of the heat receiver 100B according to the related art will be described.

The thermal resistance $\theta_{cp1}$ [° C./W] of the heat receiver 100A according to the embodiment is calculated by the following formula (1) by supplying a coolant to the heat receiver 100A which is caused to abut against the CPU 6 on the printed circuit board 4.

$$\theta_{cp1} = (T_{cp1} - T_{in1})/W_1 \qquad (1)$$

In the formula (1), $T_{in1}$ is the temperature [° C.] of the coolant which is supplied to the heat receiver 100A, $T_{cp1}$ is the temperature [° C.] of a heat receiving surface of the second heat receiving body 120 which abuts against the CPU 6, and $W_1$ is the amount of heat [W] generated by the CPU 6 which abuts against the heat receiver 100A.

Meanwhile, the thermal resistance $\theta_{cp2}$ [° C./W] of the heat receiver 100B according to the related art is calculated by the following formula (2) by supplying a coolant to the heat receiver 100B which is caused to abut against a CPU provided on a printed circuit board.

$$\theta_{cp2}=(T_{cp2}-T_{in2})/W_2 \qquad (2)$$

In the formula (2), $T_{in2}$ is the temperature [° C.] of the coolant which is supplied to the heat receiver 100B, $T_{cp2}$ is the temperature [° C.] of a heat receiving surface of the flow path 192 which abuts against the CPU, and $W_2$ is the amount of heat [W] generated by the CPU which abuts against the heat receiver 100B.

Figure 13:
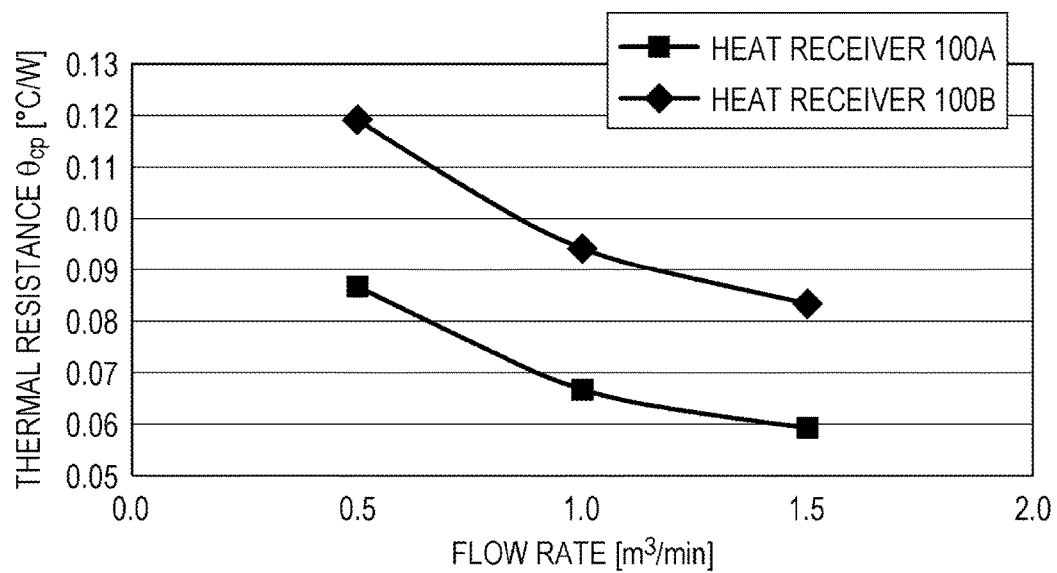
FIG. 13 illustrates the results of measuring thermal resistance.

FIG. 13 illustrates the results of measuring the thermal resistance $\theta_{cp1}$ of the heat receiver 100A according to the embodiment and the thermal resistance $\theta_{cp2}$ of the heat receiver 100B according to the related art while varying the flow rate of the coolant.

As illustrated in FIG. 13, the thermal resistance $\theta_{cp1}$ of the heat receiver 100A according to the embodiment is lower than the thermal resistance $\theta_{cp2}$ of the heat receiver 100B according to the related art by about 30% at the same flow rate of the coolant. Thus, it is seen that the heat receiver 100A according to the embodiment is lower in thermal resistance $\theta_{cp}$ than the heat receiver 100B according to the related art and has improved cooling performance to cool a heat generating body such as the CPU 6.

In the heat receiver 100A according to the embodiment, heat from the CPU 6 is received and radiated to the coolant by two layers, namely the first heat receiving body 110 and the second heat receiving body 120 which are stacked on each other. Thus, the heat receiver 100A according to the embodiment has improved cooling performance to cool a heat generating body such as the CPU compared to the heat receiver 100B according to the related art, in which heat from the CPU is radiated to the coolant by one layer, namely the flow path 192.

In the heat receiver 100A according to the embodiment, in addition, the flow path cross-sectional area of the second heat receiving body 120 is less than the flow path cross-sectional area of the first heat receiving body 110. With such a configuration, the flow rate of the coolant in the second heat receiving body 120 is higher than the flow rate in the first heat receiving body 110 so that the coolant may absorb heat from the CPU 6 and rapidly send the heat to the outside of the heat receiver 100A. In addition, the first path 121a and the second path 121b are formed in the second flow path 121 of the second heat receiving body 120. With such a configuration, the coolant at an increased flow rate may absorb heat of the CPU 6 in both the first path 121a and the second path 121b of the second heat receiving body 120 and send the heat to the outside of the heat receiver 100A. Thus, in the heat receiver 100A according to the embodiment, the efficiency of heat reception at the second heat receiving body 120 is enhanced to improve the cooling performance to cool a heat generating body such as the CPU.

In the heat receiver 100A according to the embodiment, in addition, the supply chamber 152, the first communication chamber 153, the second communication chamber 162, and the discharge chamber 163, through which the coolant flows, are formed in the first coupling body 150 and the second coupling body 160 which support the first heat receiving body 110 and the second heat receiving body 120 as stacked on each other. With such a configuration, the coolant may be caused to flow through the first flow path 111 and the second flow path 121 without increasing the size of the heat receiver 100A.

In the heat receiver 100A according to the embodiment, in addition, the connection plate 130 is provided between the second heat receiving body 120 and the first heat receiving body 110. In the connection plate 130, heat conducted from the second heat receiving body 120 is diffused and transmitted to a larger region of the first heat receiving body 110, which improves the efficiency of heat reception at the first heat receiving body 110. When the efficiency of heat reception at the first heat receiving body 110 is enhanced by the connection plate 130, the cooling performance of the heat receiver 100A is improved.

While an embodiment has been discussed in detail above, the present disclosure is not limited to the embodiment described above, and a variety of modifications and alterations may be made within the scope of the claims.

For example, the heat generating body to be cooled by the heat receiver 100A may be various electronic components that are different from a CPU. In addition, the cooling unit 10 may be configured differently to circulate the coolant through the heat receiver 100A. Further, the electronic device 1 on which the cooling unit 10 which has the heat receiver 100A is mounted is not limited to a PC or a server, and may be any device that has an electronic component that serves as a heat generating body.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:
1. A heat receiver comprising:
   a first heat receiving body that includes a first flow path through which a coolant flows;
   a second heat receiving body that includes a second flow path through which the coolant discharged from the first flow path flows for receiving heat from a heat generating body at one side of the second heat receiving body;
   a first coupling body that couples one end of the first heat receiving body and one end of the second heat receiving body; and
   a second coupling body that couples another end of the first heat receiving body and another end of the second heat receiving body,
   wherein the first heat receiving body is stacked on another side of the second heat receiving body in a heat conducted manner, and
   wherein a flow path cross-sectional area of the second flow path is less than a flow path cross-sectional area of the first flow path so that a flow rate of the coolant through the second flow path is higher than a flow rate of the coolant through the first flow path,
   wherein the second flow path includes a first path in which the coolant discharged from the first flow path flows in a first direction, and a second path in which the coolant discharged from the first path flows in a second direction that is opposite to the first direction, wherein the first coupling body includes a supply chamber from which the coolant is supplied to the first flow path and a first communication chamber from which the coolant discharged from the first path is supplied to the second path, and the second coupling body includes a second communication chamber from which the coolant discharged from the first flow path is supplied to the first path and a discharge chamber to which the coolant is discharged from the second path.

2. The heat receiver according to claim 1, wherein the first flow path and the second flow path include a plurality of fins that extend in respective directions in which the coolant flows.

3. The heat receiver according to claim 1, further comprising:

a connection plate provided between the first heat receiving body and the second heat receiving body to conduct heat from the second heat receiving body to the first heat receiving body.

4. The heat receiver according to claim 1, wherein the second flow path is serially coupled to the first flow path.

5. A cooling unit comprising:

a heat receiver comprising:

a first heat receiving body that includes a first flow path through which a coolant flows;

a second heat receiving body that includes a second flow path through which the coolant discharged from the first flow path flows for receiving heat from a heat generating body at one side of the second heat receiving body;

a first coupling body that couples one end of the first heat receiving body and one end of the second heat receiving body; and a second coupling body that couples another end of the first heat receiving body and another end of the second heat receiving body, wherein the first heat receiving body is stacked on another side of the second heat receiving body in a heat conducted manner, and wherein a flow path cross-sectional area of the second flow path is less than a flow path cross-sectional area of the first flow path so that a flow rate of the coolant through the second flow path is higher than a flow rate of the coolant through the first flow path, wherein the second flow path includes a first path in which the coolant discharged from the first flow path flows in a first direction, and a second path in which the coolant discharged from the first path flows in a second direction that is opposite to the first direction, wherein the first coupling body includes a supply chamber from which the coolant is supplied to the first flow path and a first communication chamber from which the coolant discharged from the first path is supplied to the second path, and the second coupling body includes a second communication chamber from which the coolant discharged from the first flow path is supplied to the first path and a discharge chamber to which the coolant is discharged from the second path; and a coolant supply that supplies the coolant to the heat receiver.

6. The cooling unit according to claim 5, wherein the second flow path is serially coupled to the first flow path.

7. An electronic device comprising;

a heat generating body;

a heat receiver comprising:

a first heat receiving body that includes a first flow path through which a coolant flows;

a second heat receiving body that includes a second flow path through which the coolant discharged from the first flow path flows for receiving heat from a heat generating body at one side of the second heat receiving body;

a first coupling body that couples one end of the first heat receiving body and one end of the second heat receiving body; and a second coupling body that couples another end of the first heat receiving body and another end of the second heat receiving body, wherein the first heat receiving body is stacked on another side of the second heat receiving body in a heat conducted manner, and wherein a flow path cross-sectional area of the second flow path is less than a flow path cross-sectional area of the first flow path so that a flow rate of the coolant through the second flow path is higher than a flow rate of the coolant through the first flow path, wherein the second flow path includes a first path in which the coolant discharged from the first flow path flows in a first direction, and a second path in which the coolant discharged from the first path flows in a second direction that is opposite to the first direction, wherein the first coupling body includes a supply chamber from which the coolant is supplied to the first flow path and a first communication chamber from which the coolant discharged from the first path is supplied to the second path, and the second coupling body includes a second communication chamber from which the coolant discharged from the first flow path is supplied to the first path and a discharge chamber to which the coolant is discharged from the second path, and wherein the heat generating body is thermally coupled with a side of the second heat receiving body opposite to the side on which the first heat receiving body is provided; and a coolant supply that supplies the coolant to the heat receiver.

8. The electronic device according to claim 7, wherein the second flow path is serially coupled to the first flow path.

* * * * *